United States Patent
Weng et al.

(10) Patent No.: US 9,673,795 B2
(45) Date of Patent: Jun. 6, 2017

(54) INTEGRATED CIRCUIT ASSOCIATED WITH CLOCK GENERATOR, AND ASSOCIATED CONTROL METHOD

(71) Applicant: MStar Semiconductor, Inc., Hsinchu Hsien (TW)

(72) Inventors: Meng-Tse Weng, Zhubei (TW); Jiunn-Yih Lee, Zhubei (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 15/018,012

(22) Filed: Feb. 8, 2016

(65) Prior Publication Data

US 2017/0070218 A1    Mar. 9, 2017

(30) Foreign Application Priority Data

Sep. 4, 2015 (TW) .............................. 104129329 A

(51) Int. Cl.
*H04L 7/04* (2006.01)
*H03K 5/13* (2014.01)
*H03K 21/02* (2006.01)
*H03K 5/00* (2006.01)

(52) U.S. Cl.
CPC ............. *H03K 5/13* (2013.01); *H03K 21/026* (2013.01); *H04L 7/04* (2013.01); *H03K 2005/00052* (2013.01)

(58) Field of Classification Search
CPC ......... H04L 7/02; H04L 7/033; H04L 7/0337; H04L 7/04
See application file for complete search history.

(56) References Cited

U.S. PATENT DOCUMENTS

| | | | |
|---|---|---|---|
| 7,609,102 B2 * | 10/2009 | Shanbhag | H03D 13/003 327/12 |
| 7,795,926 B2 * | 9/2010 | Tseng | H03L 7/089 327/7 |
| 8,175,207 B2 | 5/2012 | Do et al. | |
| 8,520,793 B2 * | 8/2013 | Lin | H04L 7/033 375/224 |
| 8,948,332 B2 | 2/2015 | Kenney et al. | |

OTHER PUBLICATIONS

TIPO Office Action, May 4, 2016, 6 pages.

\* cited by examiner

*Primary Examiner* — Jeffrey Zweizig
(74) *Attorney, Agent, or Firm* — Edell, Shapiro & Finnan, LLC

(57) ABSTRACT

An integrated circuit includes a data sampler and a digital logic circuit. The data sampler provides multiple signal samples at a speed twice a symbol rate according to a local clock signal and the inverted local clock signal. The signal samples include a first symbol sample, and a second symbol sample that occurs later than the first symbol sample. The signal samples further include an interpolated sample between the first and second symbol samples. The digital logic circuit compares the first symbol sample with the interpolated sample to generate pre phase correction data, and compares the second symbol sample with the interpolated sample to generate post phase correction data. The pre phase correction data is generated earlier than the post phase correction data. The local clock signal and the inverted local clock signal have substantially a phase difference of 180 degrees.

14 Claims, 7 Drawing Sheets

| signal sample DA | signal sample DB | signal sample DC | DA ⊕ DB | DB ⊕ DC | sampling instant | $f_{CLK}$ |
|---|---|---|---|---|---|---|
| 0 | 0 | 0 | 0 | 0 | whether appropriate is unknown | unchanged |
| 0 | 0 | 1 | 0 | 1 | too early | ↘ |
| 0 | 1 | 0 | 1 | 1 | whether appropriate is unknown | defined by designer |
| 0 | 1 | 1 | 1 | 0 | too slow | ↗ |
| 1 | 0 | 0 | 1 | 0 | too slow | ↗ |
| 1 | 0 | 1 | 1 | 1 | whether appropriate is unknown | defined by designer |
| 1 | 1 | 0 | 0 | 1 | too early | ↘ |
| 1 | 1 | 1 | 0 | 0 | whether appropriate is unknown | unchanged |

INTEGRATED CIRCUIT ASSOCIATED WITH CLOCK GENERATOR, AND ASSOCIATED CONTROL METHOD

This application claims the benefit of Taiwan application Serial No. 104129329, filed Sep. 4, 2015, the subject matter of which is incorporated herein by reference.

BACKGROUND OF THE INVENTION

Field of the Invention

The invention relates in general to a phase detector, and more particularly to an asynchronous phase detector applied in a clock and data recovery circuit.

Description of the Related Art

A data stream received by an optical or wireless receiver is both asynchronous and noisy. For subsequent processing, timing information, e.g., a clock, must be extracted from the data stream so as to allow synchronous operations. Furthermore, the data stream must be "retimed" such that the jitter accumulated during transmission is removed. To complete the task of clock extraction and data retiming, "clock and data recovery" (CDR) circuits are extensively applied in optical or wireless receivers.

FIG. 1 shows a diagram of data eye patterns and several sampling instants of a data stream. FIG. 2 shows correspondence between inputs and outputs of an Alexander phase detector. According to a local clock signal, an Alexander phase detector oversamples an input signal carrying a data stream at sampling instants A, B and C at a rate approximately twice a symbol rate of the input signal to generate signal samples DA, DB and DC, respectively. For transmission speed considerations, input signals are generally coded in nonreturn-to-zero (NRZ) format. When the local clock signal is approximately synchronous with the timing of the data stream, the sampling instants A, B and C are spaced by a half of a symbol period from one another, and the sampling instant B is approximately located near an intersection between two eyes of the data eye patterns. For example, if the signal samples DA, DB and DC are respectively logic "0", "0" and "1", it means that the sampling instant B is earlier than the intersection between two eyes of the data eye patterns. Thus, as shown in FIG. 2, the output of the Alexander phase detector should slow down the clock frequency $f_{CLK}$ of the local clock signal such that the subsequent sampling instant B may approach the intersection.

FIG. 2 shows pre XOR operation results of signal samples DA and DB and post-XOR operation results of signal samples DB and DC. When the pre XOR operation result and the post XOR operation result are respectively "0" and "1", the clock frequency $f_{CLK}$ of the local clock signal is expected to slow down. When the pre XOR operation result and the post XOR operation result are respectively "0" and "0", it means that the signal samples are the same logic values, and the sequence relationship between the intersection and the sampling instant B cannot be learned. Thus, the clock frequency of the local clock signal is kept unchanged. When the pre XOR operation result and the post XOR operation result are respectively "1" and "0", the clock frequency of the local clock signal is expected to increase. When the pre XOR operation result and the post XOR operation result are respectively "1" and "1", it means that there are two intersections between the sampling instants A and C, and such occurrence is fundamentally unexpected to happen. At this point, the clock frequency $f_{CLK}$ may react according to the definition of the circuit designer.

SUMMARY OF THE INVENTION

An integrated circuit is disclosed according to an embodiment of the present invention. The integrated circuit generates and provides a plurality of sets of phase correction data to a clock generator to provide a local clock signal. The integrated circuit includes a data sampler and a digital logic circuit. The data sampler provides a plurality of signal samples at a speed that is twice a symbol rate according to the local clock signal and an inverted local clock signal. The signal samples include a first symbol sample and a second symbol sample. The second symbol sample occurs later than the first symbol sample by one symbol period. The signal samples further include an interpolated sample between the first and second symbol samples. The digital logic circuit compares the first symbol sample with the interpolated sample to generate pre phase correction data, and compares the second symbol sample and the interpolated sample to generate post phase correction data. Compared to the post phase correction data, the pre phase correction data is generated earlier. The local clock signal and the inverted local clock signal have substantially a phase difference of 180 degrees.

A control method for a clock generator is further disclosed according to an embodiment of the present invention. The clock generator provides a local clock signal and an inverted local clock signal that have substantially a phase difference of 180 degrees. The control method samples a data stream at a speed that is twice a symbol rate according to the local clock signal and the inverted local clock signal to provide a plurality of signal samples. The signal samples include a first symbol sample and a second symbol sample. The second symbol sample occurs later than the first symbol sample by one symbol period. The signal samples further include an interpolated sample between the first and second symbol samples. The control method further compares the first symbol sample with the interpolated sample to generate pre phase correction data, and compares the second symbol sample with the interpolated sample to generate post phase correction data. The control method further affects the clock generator by the pre phase correction data to adjust the local clock signal, and affects the clock generator by the post phase correction data to adjust the local clock signal. Compared to the post phase correction data, the pre phase correction data affects the clock generator earlier.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 3A:
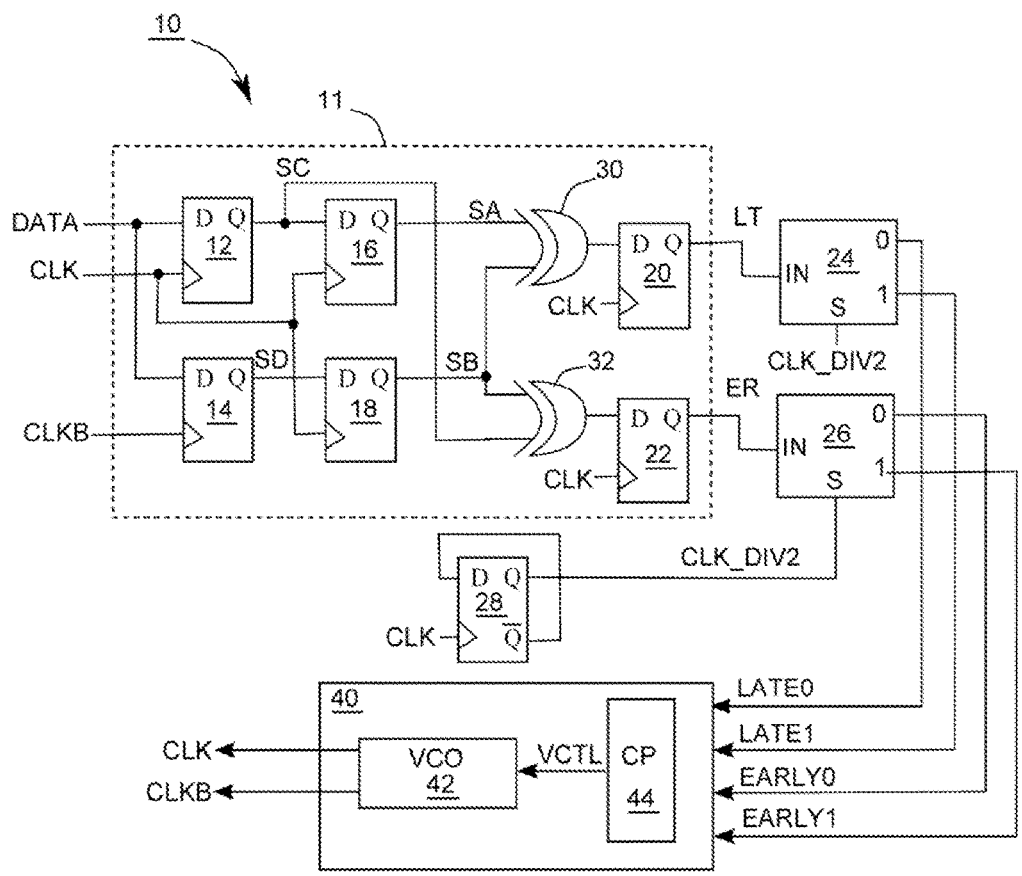
FIG. 3A shows a conventional clock and data recovery (CDR) circuit.
Figure 3B:
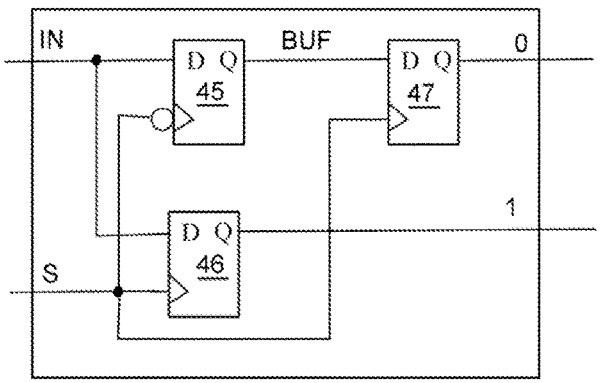
FIG. 3B is an example of a multipath output selector.
Figure 4:
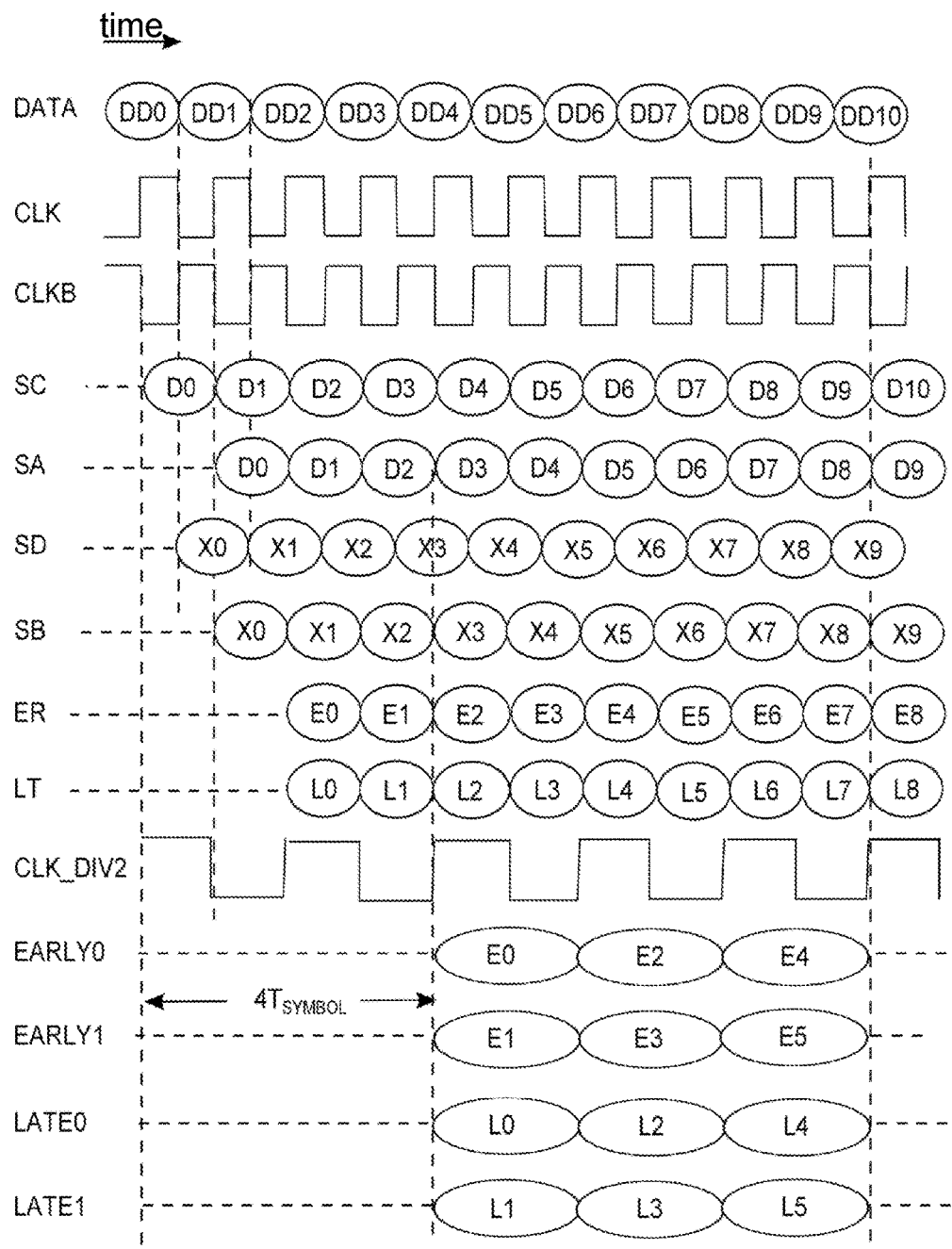
FIG. 4 is an exemplary timing diagram of the circuit in FIG. 3A.

FIG. 3A shows a conventional clock and data recovery (CDR) circuit 10, which includes an Alexander phase detector 11, multipath output selectors 24 and 26, and a clock generator 40. FIG. 3B shows an example of a multipath output selector. FIG. 4 shows an exemplary signal timing diagram of the circuit in 3A.

As shown in FIG. 4, a data stream at a DATA end carries analog symbols DD0, DD1 . . . , with each of the analog symbols appearing for the duration of approximately one symbol period $T_{SYMBOL}$. A reciprocal of the $T_{SYMBOL}$ is referred to as a symbol rate. Local clock signals CLK and CLKB have have a phase difference of 180 degrees, and have clock frequencies approximately equal to the symbol rate of the data stream. Each rising edge of the local clock signal CLK appears approximately in the middle of the symbol period of each analog symbol, and each rising edge of the local clock signal CLKB appears approximately at each intersection of two adjacent analog symbols.

Refer to FIG. 3 and FIG. 4. D flip-flops 12 and 14 together serve as a data sampler that samples data signals at a DATA end. The D flip-flop 12 samples rising edges of the local signal CLK to sequentially generate symbol samples D0, D1 . . . at an SC end, and thus may be regarded as a symbol sampler. Similarly, the D flip-flop 14 samples rising edges of the local clock signal CLKB to sequentially generate interpolated samples X0, X1 . . . at the SD end, and thus may be regarded as an intervening sampler. For example, when a rising edge of the local clock signal CLK appears, if a voltage of the analog signal at the DATA end is higher than a threshold, the D flip-flop 12 generates a symbol sample having a logic value "1". Conversely, if the voltage of the analog signal on the DATA end is lower than the threshold, the D flip-flop 12 generates a symbol sample having a logic value "0". The symbol sample and the interpolated sample are both signal samples generated from sampling the data signal at the DATA end. Once the timing of the local clock signal CLK is synchronized with the timing of the data stream at the DATA end, the symbol samples D0, D1 . . . are approximately comparison results of analog signals DD0, DD1 . . . with a threshold. The instant at which the symbol sample D1 is generated is later than the instant at which the symbol sample D0 is generated by approximately one symbol period $T_{SYMBOL}$.

As shown in FIGS. 3A and FIG. 4, when the rising edge of the local clock signal CLK appears, the symbol sample on an SC end and the interpolated sample on an SD end are latched by D flip flops 16 and 18 at an SA end and an SB end, respectively. An XOR gate 30 compares the symbol sample on the SA end with the interpolated sample on the SB end to provide pre phase correction data. When the rising edge of the local clock signal CLK appears, the pre phase correction data is latched by a D flip flop at an LT end. Thus, as shown in FIG. 4, pre phase correction data L0, L1 . . . sequentially appears at the LT end. For example, a value of the pre phase correction data L0 depends on whether values of the symbol sample D0 and the interpolated sample X0 are the same or not, and a value of the pre phase correction data L1 depends on whether values of the symbol sample D1 and interpolated sample X1 are the same or not.

Figure 5:
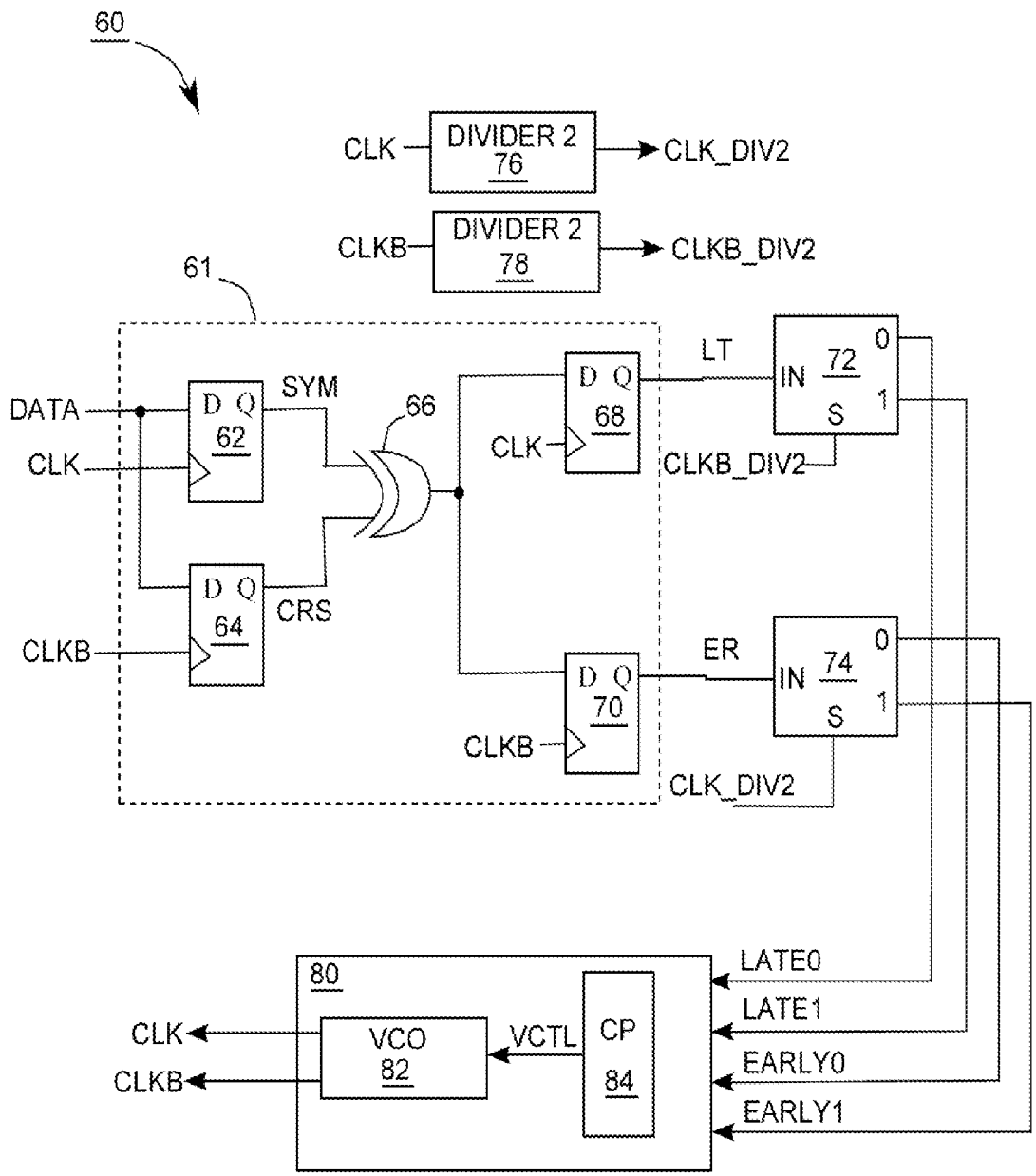
FIG. 5 shows a CDR circuit according to an embodiment of the present invention.

An XOR gate 32 compares the symbol sample on the SC end with the interpolated sample on the SB end to provide post phase correction data. When the rising edge of the local clock signal CLK appears, the post phase correction data is latched by a D flip flop 22 at an ER end. Thus, as shown in FIG. 5, post phase correction data E0, E1 . . . sequentially appears at the ER end. For example, a value of the post phase correction data E0 depends on whether values of the symbol sample D1 and the interpolated sample X0 are the same or not, and a value of the post phase correction data E1 depends on whether values of the symbol sample D2 and interpolated sample X1 are the same or not.

A D flip-flop 28 serves as a frequency divider having a divisor of 2, and generates a local frequency divided clock signal CLK_DIV2 according to the local clock signal CLK. The clock frequency of the local frequency divided clock signal CLK_DIV2 is about one half of that of the local clock signal CLK.

According to the logic value of the local frequency divided clock signal CLK_DIV2, the multipath output selector 24 forwards the pre phase correction data L0, L1, L2 . . . sequentially appearing at the LT end to LATE0 and LATE1 ends in a paired and parallel manner. FIG. 3B may be utilized to explain operations of the multipath output selector 24 in FIG. 3A. For example, when a falling edge of the local frequency divided clock signal CLK_DIV2 appears, the pre phase correction data L0 is latched by a D flip flop at a BUF end. When a next rising edge of the local frequency divided clock signal CLK_DIV2 appears, the D flip-flop 45 outputs the phase correction data L0 on the BUF end to the LATE0 end, and a D flip-flop 46 outputs the pre phase correction data L1 to the LATE1 end, as shown in FIG. 4.

According to the logic value of the local frequency divided clock signal CLK_DIV2, the multipath output selector 26 forwards the post phase correction data E0, E1, E2 . . . sequentially appearing at the ER end to EARLY0 and EARLY1 ends in a paired and parallel manner. Operation principles of the multipath output selector 26 may be referred and learned from the description associated with the multipath output selector 24, and shall be omitted herein.

The clock generator 40 adjusts the clock frequencies of the local clock signals CLK and CLKB according to the pre phase correction data on the LATE0 and LATE1 ends and the post phase correction data on the EARLY0 and EARLY1 ends. Each set of pre phase correction data on the LATE0 and LATE1 ends is equal to the pre XOR operation result (=DA⊕DB) in FIG. 2, and each set of post phase correction data on the EARLY0 and EARLY1 ends is equal to the post XOR operation result (=DB⊕DC) in FIG. 2. According to the rules in FIG. 2 as well as the pre and post phase correction data currently received, the clock generator 40 adjusts the clock frequency $f_{CLK}$ of the local clock signal CLK. For example, if the clock generator 40 discovers that the pre phase correction data L0 and L1 and the post phase correction data E0 and E1 is respectively 0, 0, 1 and 1, the clock generator 40 causes a charge pump (CP) 44 to reduce a control voltage VCTL, such that the oscillation frequency of a voltage-controlled oscillator (VCO) is reduced, hence reducing the clock frequency $f_{CLK}$ of the local clock signal CLK.

It is discovered from the above analysis that, because the D flip-flops 20 and 22 synchronously output one set of pre phase correction data and one set of post phase correction data, the Alexander phase detector 11 is a synchronized phase detector. It is also discovered from the timing diagram in FIG. 4, from an instant at which the symbol sample D0 appears in the Alexander phase detector 11, only after four symbol periods $T_{SYMBOL}$, the pre phase correction data L0 corresponding to the symbol sample D0 appears at the LATE0 end, and the post phase correction data E0 corresponding to the interpolated sample X0 also simultaneously appears at the EARLY0 end. The pre phase correction data L0 and the post phase correction data E0 simultaneously arrives at the clock generator 40, which then starts adjusting the frequency according to the pre phase correction data L0 and the post phase correction data E0. In other words, the response latency of the CDR circuit 10 in FIG. 3A with respect to the input signal is about 4 symbol periods $T_{SYMBOL}$.

Figure 6:
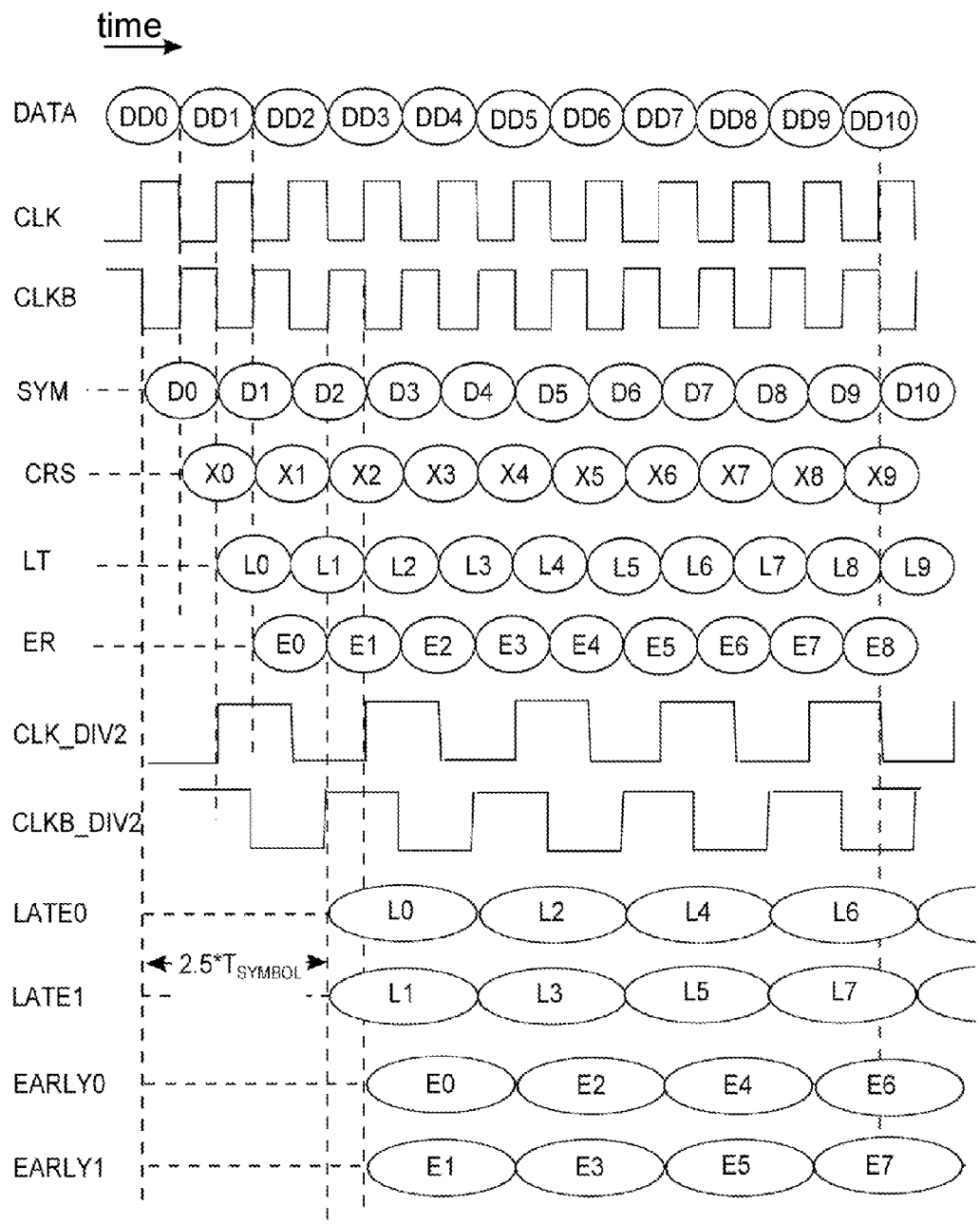
FIG. 6 is an exemplary timing diagram of the circuit in FIG. 5.

FIG. 5 shows a CDR circuit 60 according to an embodiment of the present invention. The CDR circuit 60 includes an Alexander phase detector 61, multipath output selectors 72 and 74, and a clock generator 80. FIG. 6 shows an example of signal timing when the circuit in FIG. 5 is in operation.

D flip-flops 62 and 64 in FIG. 5 serve as a symbol sampler and an intervening sampler, respectively. Operations and functions of the D flip-flops 62 and 64 are identical or analogous to those of the D flip-flops 12 and 14 in FIG. 3A. Thus, details of the analog signals DD0, DD1 . . . on the DATA end, the symbol samples D0, D1 . . . on a SYM end, and the interpolated samples X0, X1 . . . on an CRD end in FIG. 6 may be known from the description associated with FIG. 3 and FIG. 4, and shall be omitted for simplicity.

An XOR gate 66 compares the symbol sample on the SYM end with the interpolated sample on the CRS end. As the time progresses, the XOR gate 66 alternately outputs the precursors for pre phase correction data and post phase correction data. When the rising edge of the local clock CLK appears, an output signal of the XOR gate 66 is latched by a D flip-flop 68 and outputted to the LT end. When the rising edge of the local clock signal CLKB appears (equivalent to the falling edge of the local clock signal CLK), the output signal of the XOR gate 66 is latched by a D flip-flop 70 and outputted to the ER end. In one embodiment of the present invention, the XOR gate may be implemented by a conventional digital logic gate. In another embodiment of the present invention, the XOR gate may be implemented by a Gilbert cell circuit. As shown in FIG. 6, the pre phase correction data L0, L1 . . . sequentially appears on the LT end, and the post phase correction data E0, E1 . . . sequentially appears on the ER end, with the timings of pre phase correction data L0 and the post phase correction data E0 being asynchronous. Thus, the Alexander phase detector 61 in FIG. 5 is an asynchronous phase detector. It is apparent that, the instant at which the pre phase correction data L0 appears is earlier than the instant at which the post phase correction data E0 appears by about 0.5 symbol period $T_{SYMBOL}$.

In FIG. 5, frequency dividers 76 and 78 having a divisor of 2 generate local frequency divided signals CLK_DIV2 and CLKB_DIV2 according to the local clock signals CLK and CLKB, respectively. For example, each of the frequency dividers 76 and 78 having a divisor of 2 is a D flip-flop, which has an inverted output connected to its data input, similar to the D flip-flop 28 in FIG. 3A.

According to the logic value of the local frequency divided clock signal CLKDB_DIV2, the multipath output selector 72 forwards the pre phase correction data L0, L1, L2 . . . sequentially appearing at the LT end to the LATE0 and LATE1 ends in a paired and parallel manner.

The circuit in FIG. 3B may be utilized to explain the operations of the multipath output selector 72 in FIG. 5. For example, when a next falling edge of the local frequency reduced clock signal CLKB_DIV2 appears, the pre phase correction data L0 is latched by the D flip flop 45 at the BUF end. When a next rising edge of the local frequency reduced clock signal CLKB_DIV2 appears, the D flip-flop 47 outputs the pre phase correction data L0 on the BUF end to the LATE0 end, and the D flip-flop 46 outputs the pre phase correction data L0 on the LT end to the LATE1 end, as shown in FIG. 6.

According to the logic value of the local frequency divided clock signal CLK_DIV2, the multipath output selector 74 forwards the post phase correction data E0, E1, E2 . . . sequentially appearing at the ER end to the EARLY0 and EARLY1 ends in a paired and parallel manner. Operation principles of the multipath output selector 74 may be referred and learned from the description on the multipath output selector 72, and shall be omitted herein. It should be noted that, the multipath output selector 74 operates according to the local frequency divided clock signal CLK_DIV2, and the multipath output selector 72 operates according to the local frequency divided clock signal CLKB_DIV2.

According to the pre phase correction data on the LATE0 and LATE1 ends as well as the post phase correction data on the EARLY0 and EARLY1 ends, the clock generator 80 in FIG. 5 may adjust the control voltage VCTL through the charge pump 84. The clock generator 80 may also control the clock frequency $f_{CLK}$ according to the rules in FIG. 2.

Figure 7:
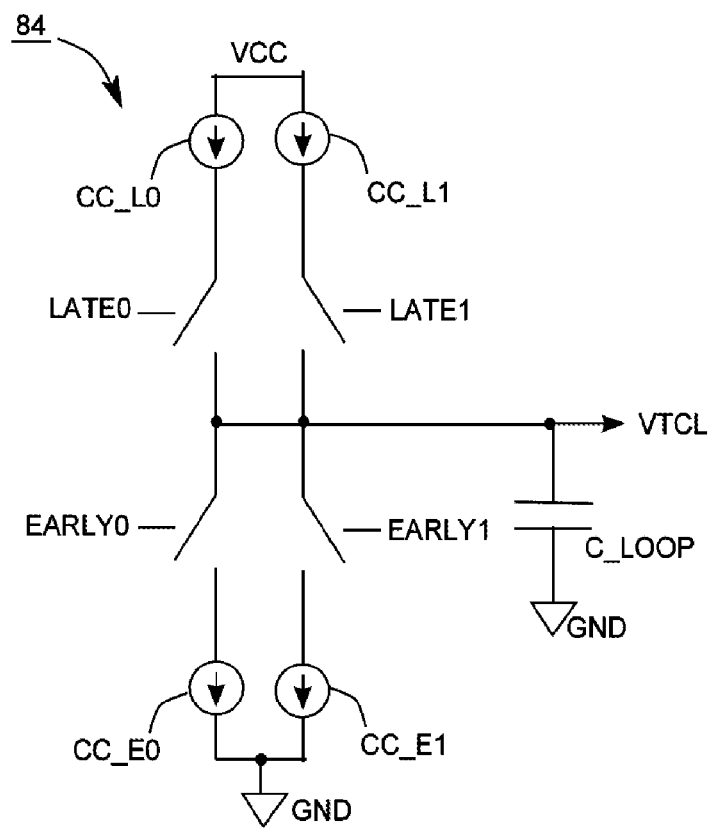
FIG. 7 is an example of a charge pump in FIG. 5.

FIG. 7 shows an example of the charge pump 84 in FIG. 5. The charge pump 84 includes four constant current sources CC_L0, CC_L1, CC_E0 and CC_E1, each of which providing a constant current having substantially the same current value. In the charge pump 84, the post phase correction data on the EARLY0 and EARLY1 ends respectively controls the two constant current sources (CC_E0 and CC_E1) for pulling down the control voltage VCTL, and the pre phase correction data on the LATE0 and LATE1 ends respectively controls the two constant current sources (CC_L0 and CC_L1) for pulling up the control voltage VCTL. Since the effect of the pre phase correction data on the LATE0 and LATE1 has on the control voltage CTRL is the same, in the following description, only the pre phase correction data on the LATE0 end is taken an example to explain the effect that the pre phase correction data on the LATE0 or LATE1 end has on the control voltage CTRL.

Figures 1, 2:
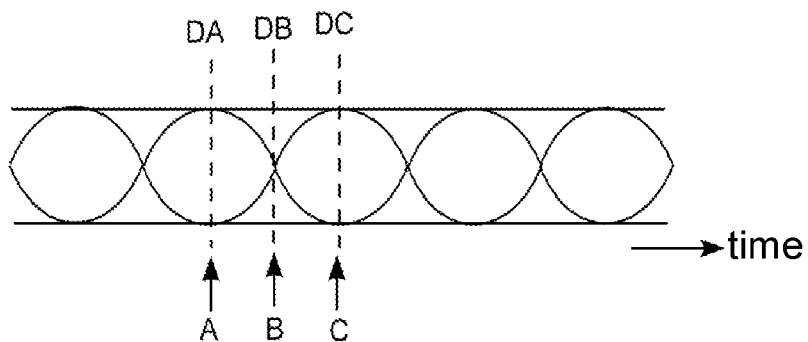
FIG. 1 is a diagram of data eye patterns of a data stream.
FIG. 2 shows correspondence between the inputs and outputs of an Alexander phase detector.

When the pre phase correction data on the LATE0 end and the post phase correction data on the EARLY0 end has the same logic value, the currents provided by the constant current sources CC_L0 and CC_E0 are either blocked by two open switches or substantially counteracted by each other, hence leaving the control voltage VCTL unaffected. If the pre phase correction data on the LATE0 end is logic "1" and the post phase correction data on the EARLY0 end is logic "0", the constant current provided by the constant current source CC_L0 may potentially charge a capacitor C_LOOP to pull up the control voltage VCTL to further cause the clock frequency $f_{CLK}$ of the local clock signal CLK to rise. In contrast, if the pre phase correction data on the LATE0 end is logic "0" and the post phase correction data on the EARLY0 end is logic "1", the constant current provided by the constant current source CC_E0 potentially discharges the capacitor C_LOOP to pull down the control voltage VCTL to further cause the clock frequency $f_{CLK}$ of the local clock signal CLK to drop. The charge pump in the foregoing description is an exemplary approach. Given the principles in FIG. 2 are satisfied, and the clock frequency is increased when the pre phase correction data on the LATE0 and LATE1 ends are logic "1", and the clock frequency is reduced when the post phase correction data on the EARLY0 and EARLY1 ends are logic "1", any method can be implemented.

The CDR circuit 60 in FIG. 5 is capable of achieving a similar or the same function of frequency adjustment as the CDR circuit 10 in FIG. 3A.

Figures 8A, 8B:
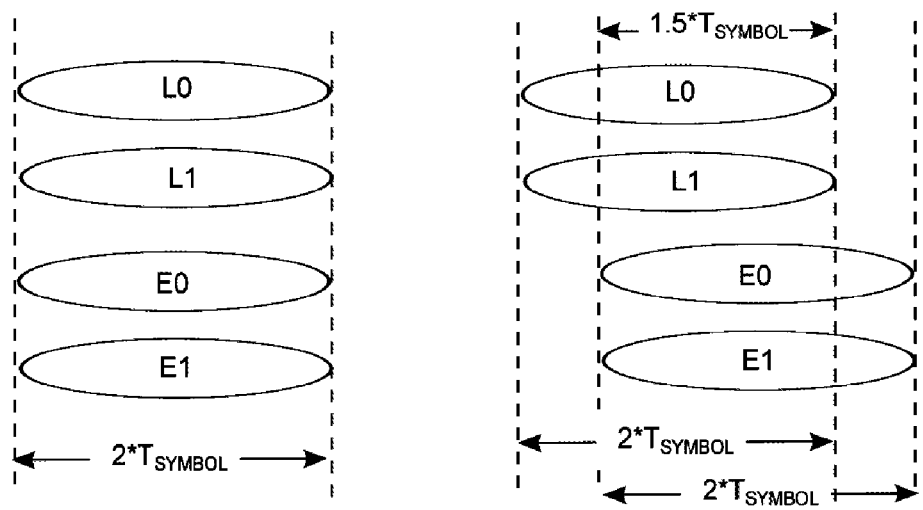
FIG. 8A is a partial diagram of FIG. 4.
FIG. 8B is a partial diagram of FIG. 6.

FIG. 8A shows a partial diagram of FIG. 4, and depicts the pre phase correction data L0 and L1 as well as the post phase correction data E0 and E1 simultaneously arriving at the charge pump 44. It should be noted that, each set of the pre phase correction data L0 and L1 and the post phase correction data E0 and E1 affects the charge pump 44 by a period of $2*T_{SYMBOL}$.

For comparison, FIG. 8B shows a partial diagram of FIG. 6, and depicts the pre phase correction data L0 and L1 arriving at and leaving the charge pump 84 earlier and the post phase correction data E0 and E1 arriving at and leaving the charge pump 84 later. However, each set of the pre phase correction data L0 and L1 and the post phase correction data E0 and E1 also affects the charge pump 84 by a period of $2*T_{SYMBOL}$. It is deduced from the circuit of the charge pump 84 that, regardless of the pre phase correction data or the post phase correction data, the logic value of each set of phase correction data has a linear and independent effect on the clock frequency $f_{CLK}$. Regardless of how much the pre phase correction data L0 and L1 arrives at the charge pump 84 earlier than the post phase correction data E0 and E1, the effects on the clock frequency $f_{CLK}$ are the same.

For example, assuming in FIG. 8A, the pre phase correction data L0 and L1 is capable of increasing the clock frequency $f_{CLK}$ and the post phase correction data E0 and E1 is capable of reducing the clock frequency $f_{CLK}$. With the clock frequency being increased by the pre phase correction data and decreased by the post phase correction data, in the period of $2*T_{SYMBOL}$ in FIG. 8A, the clock frequency $f_{CLK}$ is substantially kept the same. When the same pre phase correction data L0 and L1 and post phase correction data E0 and E1 is applied in FIG. 8B, the clock frequency $f_{CLK}$ is slightly increased along with time in the period of the first $0.5*T_{SYMBOL}$, kept unchanged in the period of the middle $1.5*T_{SYMBOL}$, and slightly reduced with time in the period of the last $0.5*T_{SYMBOL}$. However, in FIG. 8B, the clock frequency $f_{CLK}$ at the beginning and the end of the period of the $2.5*T_{SYMBOL}$ is substantially the same. Thus, the CDR 60 in FIG. 5 is capable of achieving a similar or the same function of frequency adjustment as the CDR circuit 10 in FIG. 3.

It is discovered from the above analysis that, because the D flip-flops 68 and 70 asynchronously output one set of pre phase correction data and one set of post phase correction data, respectively, the Alexander phase detector 16 is an asynchronous phase detector. Further, as shown in FIG. 6, the instant at which the pre phase correction data L0 generated according to the symbol sample D0 and the interpolated sample X0 arrives at the clock generator 80, is earlier than the instant at which the post phase correction data E0 generated according to the symbol sample D1 and the interpolated sample X0 arrives at the clock generator 80, with the time difference between the two being approximately 0.5 symbol period $T_{SYMBOL}$.

It is also discovered from the signal timing diagram of FIG. 6 that, from an instant at which the symbol sample D0 appears in the Alexander phase detector 61, after 2.5 symbol periods $T_{SYMBOL}$, the pre phase correction data L0 corresponding to the symbol sample D0 arrives at the clock generator 80, and the clock generator 80 then starts adjusting the frequency according to the pre phase correction data L0. In other words, the response latency of the CDR circuit 10 in FIG. 3A to the input signal is about 2.5 symbol periods $T_{SYMBOL}$. Compared to the CDR circuit 10 in FIG. 3A, the CDR circuit 60 in FIG. 5 has a shorter response latency.

Figure 9:
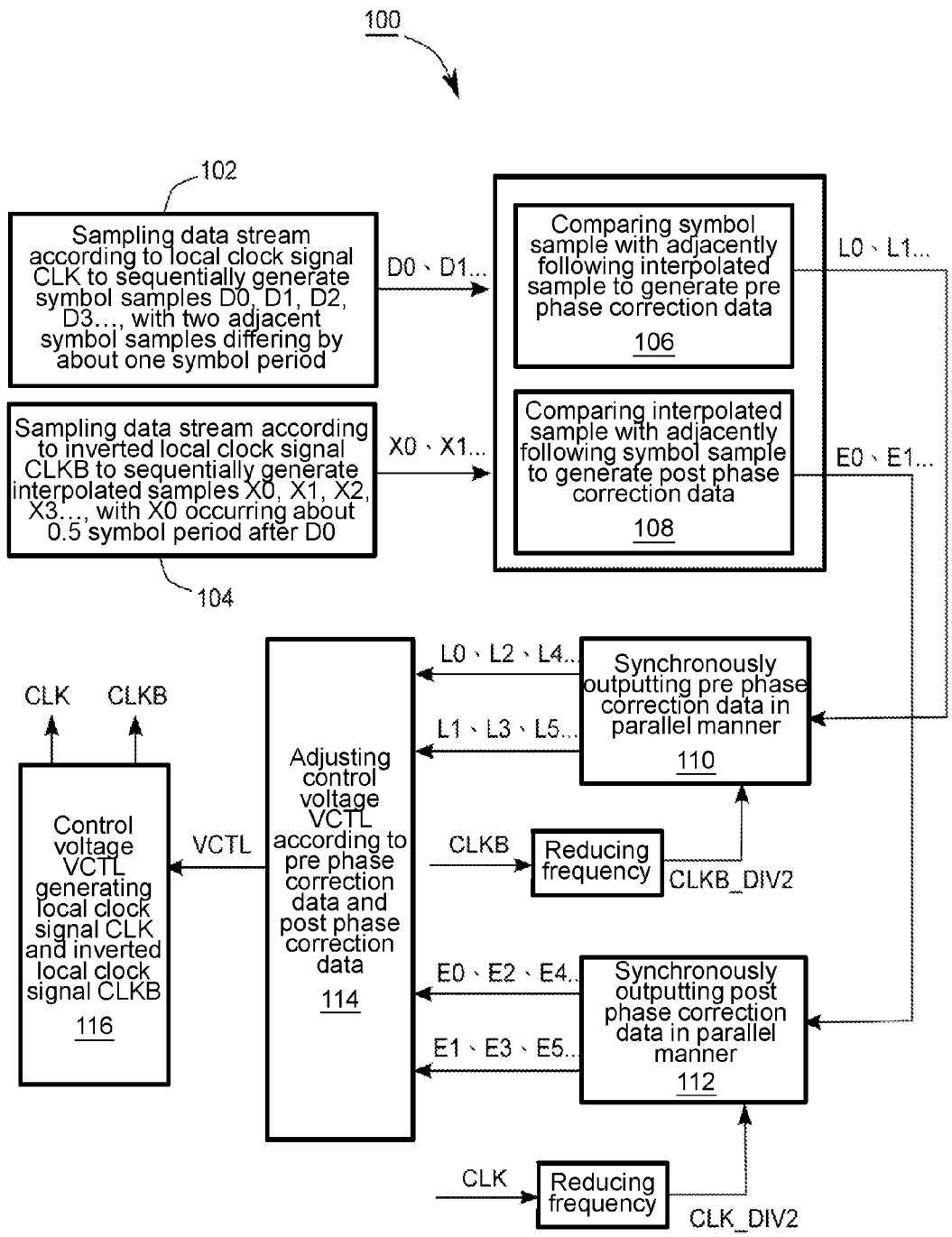
FIG. 9 shows a control method according to an embodiment of the present invention.

FIG. 9 shows a control method 100 according to an embodiment of the present invention. Details of the control method can be understood from the teaching of FIGS. 5, 6 and 7. For example, step 102 may be performed by the D flip-flop 62, and step 104 may be performed by the D flip-flop 64. Steps 106 and 108 may be performed by the XOR gate 66 in FIG. 5, and the generated pre phase correction data and post phase correction data is respectively sampled by the D flip-flops 68 and 70 in FIG. 5. Step 110 may be performed by the multipath output selector 72, and step 112 may be performed by the multipath output selector 74. Step 114 may be performed by the charge pump 84. Step 116 may be performed by a VCO 82.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An integrated circuit associated with a clock generator providing a local clock signal, comprising:
    a data sampler, configured to provide a plurality of signal samples at a speed that is twice a symbol rate according to the local clock signal and an inverted local clock signal, the signal samples comprising a first symbol sample and a second symbol sample, the second symbol sample being later than the first symbol sample by one symbol period, the signal samples further comprising an interpolated sample between the first and second symbol samples; and
    a digital logic circuit, configured to compare the first symbol sample with the interpolated sample to generate pre phase correction data, and to compare the second symbol sample with the interpolated sample to generate post phase correction data, wherein the pre phase correction data is generated earlier than the post phase correction data;
    wherein, the local clock signal and the inverted local clock signal have substantially a phase difference of 180 degrees.

2. The integrated circuit according to claim 1, wherein the data sampler comprises:
    a symbol sampler, configured to provide the first and second symbol samples according to the local clock signal; and
    an intervening sampler, configured to provide the interpolated sample according to the inverted local clock signal.

3. The integrated circuit according to claim 2, wherein the symbol sampler comprises a D flip-flop having a clock input that receives the local clock signal.

4. The integrated circuit according to claim 2, wherein the intervening sampler comprises a D flip-flop having a clock input that receives the inverted local clock signal.

5. The integrated circuit according to claim 1, further comprising:
    the clock generator receiving the pre phase correction data and the post phase correction data;

wherein, the pre phase correction data arrives at the clock generator earlier than the post phase correction data to affect an clock frequency of the local clock signal.

6. The integrated circuit according to claim 5, wherein when the first symbol sample and the interpolated sample are the same, the pre phase correction data potentially affects the clock generator to keep the clock frequency unchanged; and when the first symbol sample and the interpolated sample are different, the pre phase correction potentially affects the clock generator to increase the clock frequency.

7. The integrated circuit according to claim 5, wherein when the second symbol sample and the interpolated sample are the same, the post phase correction data potentially affects the clock generator to keep the clock frequency unchanged; and when the second symbol sample and the interpolated sample are different, the post phase correction potentially affects the clock generator to reduce the clock frequency.

8. The integrated circuit according to claim 1, wherein the digital logic circuit comprises a data comparator, the data comparator comprises a first input end and a second input end, the first input end is configured to sequentially receive the first and second symbol samples, the second input end is configured to receive the interpolated sample, and the data comparator sequentially generates the pre phase correction data and the post phase correction data.

9. The integrated circuit according to claim 8, wherein the digital logic circuit further comprises:
a first latch circuit, configured to latch the pre phase correction data according to the local clock signal; and
a second latch circuit, configured to latch the post phase correction data according to the inverted local clock signal.

10. The integrated circuit according to claim 9, wherein the first latch circuit sequentially generates first pre phase correction data and second pre phase correction data, and the second latch circuit sequentially generates first post phase correction data and second post phase correction data, further comprising:
a frequency dividing circuit, configured to provide a first local frequency divided clock signal according to the local clock signal, and to provide a second local frequency divided clock signal according to the inverted local clock signal;
a first multipath output selector, coupled to the first latch circuit, configured to synchronously output the first pre phase correction data and the second pre phase correction data in a parallel manner according to the second local frequency divided clock signal; and
a second multipath output selector, coupled to the second latch circuit, configured to synchronously output the first post phase correction data and the second post phase correction data in a parallel manner according to the first local frequency divided clock signal.

11. A control method for clock generator, the clock generator providing a local clock signal and an inverted local clock signal that have substantially a phase difference of 180 degrees, the control method comprising:
sampling a data stream at a speed that is twice a symbol rate according to the local clock signal and the inverted local clock signal to provide a plurality of signal samples; wherein, the signal samples comprise a first symbol sample and a second symbol sample, the second symbol sample being later than the first symbol sample by one symbol period, and the signal samples further comprise an interpolated sample between the first and second symbol samples;
comparing the first symbol sample with the interpolated sample to generate pre phase correction data;
comparing the second symbol sample with the interpolated sample to generate post phase correction data; and
affecting the clock generator by at least one of the pre phase correction data and the post phase correction data to adjust the local clock signal
wherein, the pre phase correction data affects the clock generator earlier than the post phase correction data.

12. The control method according to claim 11, comprising:
sampling the data stream according to the local clock signal to sequentially provide the first symbol sample and a second symbol sample; and
sampling the data stream according to the inverted local clock signal to provide the interpolated sample.

13. The control method according to claim 11, wherein the step of comparing the first symbol sample with the interpolated sample and the step of comparing the second symbol sample with the interpolated sample are performed by one single data comparator.

14. The control method according to claim 11, further comprising:
sequentially providing a plurality of sets of pre phase correction data according to the local clock signal;
sequentially providing a plurality of sets of post phase correction data according to the inverted local clock signal;
reducing a frequency of the local clock signal to generate a first local frequency divided clock signal;
reducing a frequency of the inverted local clock signal to generate a second local frequency divided clock signal;
synchronously outputting the plurality of sets of pre phase correction data in a parallel manner according to the second local frequency divided clock signal; and
synchronously outputting the plurality of sets of post phase correction data in a parallel manner according to the first local frequency divided clock signal.

* * * * *